(12) United States Patent
Sukegawa et al.

(10) Patent No.: US 12,073,885 B2
(45) Date of Patent: *Aug. 27, 2024

(54) MEMORY SYSTEM INCLUDING SEMICONDUCTOR MEMORY AND CONTROLLER

(71) Applicant: Kioxia Corporation, Minato-ku (JP)

(72) Inventors: Hiroshi Sukegawa, Tokyo (JP); Ikuo Magaki, Kawasaki (JP); Tokumasa Hara, Kawasaki (JP); Shirou Fujita, Kamakura (JP)

(73) Assignee: Kioxia Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/121,344

(22) Filed: Mar. 14, 2023

(65) Prior Publication Data

US 2023/0223083 A1 Jul. 13, 2023

Related U.S. Application Data

(63) Continuation of application No. 17/381,248, filed on Jul. 21, 2021, now Pat. No. 11,631,463, which is a
(Continued)

(51) Int. Cl.
*G11C 16/04* (2006.01)
*G06F 3/06* (2006.01)
(Continued)

(52) U.S. Cl.
CPC ............ *G11C 16/10* (2013.01); *G06F 3/0604* (2013.01); *G06F 3/064* (2013.01); *G06F 3/0659* (2013.01);
(Continued)

(58) Field of Classification Search
CPC .................................................. G11C 16/0483
(Continued)

(56) References Cited

U.S. PATENT DOCUMENTS 7,873,895 B2  1/2011  Tayler
7,916,547 B2  3/2011  Hosono
(Continued)

FOREIGN PATENT DOCUMENTS

JP    2011-3264    1/2011
JP    2011-23103   2/2011
(Continued)

OTHER PUBLICATIONS

Office Action issued May 25, 2015 in Taiwanese Patent Application No. 102131689 (w/English language translation).
(Continued)

*Primary Examiner* — Hoai V Ho
(74) *Attorney, Agent, or Firm* — Oblon, McClelland, Maier & Neustadt, L.L.P.

(57) ABSTRACT

A controller controls a memory including first and second strings. The first and second strings configure first and second string groups, respectively. In each string group, a set of memory cell transistors each from each string configures a unit. The controller is configured to: sequentially write, in the first string group, data in first units to which serially-coupled memory cell transistors respectively belong; sequentially write, in the second string group, data in first units to which serially-coupled memory cell transistors respectively belong; and sequentially write, in the first string group, data in second units to which serially-coupled memory cell transistors respectively belong.

8 Claims, 11 Drawing Sheets

Related U.S. Application Data continuation of application No. 17/101,029, filed on Nov. 23, 2020, now Pat. No. 11,100,999, which is a continuation of application No. 16/656,673, filed on Oct. 18, 2019, now Pat. No. 10,878,913, which is a continuation of application No. 16/045,956, filed on Jul. 26, 2018, now Pat. No. 10,490,282, which is a continuation of application No. 15/230,857, filed on Aug. 8, 2016, now Pat. No. 10,062,438, which is a continuation of application No. 14/200,641, filed on Mar. 7, 2014, now Pat. No. 9,431,112.

(60) Provisional application No. 61/861,456, filed on Aug. 2, 2013.

(51) Int. Cl.
*G11C 16/08* (2006.01)
*G11C 16/10* (2006.01)
*G11C 16/34* (2006.01)
*H10B 43/27* (2023.01)

(52) U.S. Cl.
CPC ........ *G06F 3/0679* (2013.01); *G11C 16/0483* (2013.01); *G11C 16/08* (2013.01); *G11C 16/3418* (2013.01); *H10B 43/27* (2023.02)

(58) Field of Classification Search
USPC ..................................... 365/185.17
See application file for complete search history.

(56) References Cited

U.S. PATENT DOCUMENTS

| | | | |
|---|---|---|---|
| 8,493,789 B2 | 7/2013 | Yoon et al. | |
| 10,062,438 B2* | 8/2018 | Sukegawa | G06F 3/0679 |
| 10,490,282 B2* | 11/2019 | Sukegawa | G11C 16/3418 |
| 10,878,913 B2* | 12/2020 | Sukegawa | G06F 3/0659 |
| 11,100,999 B2* | 8/2021 | Sukegawa | H10B 43/27 |
| 11,631,463 B2* | 4/2023 | Sukegawa | G06F 3/064 |
| | | | 365/185.17 |
| 2010/0322000 A1 | 12/2010 | Shim et al. | |
| 2011/0013458 A1 | 1/2011 | Seol | |
| 2011/0292725 A1 | 12/2011 | Choi et al. | |
| 2011/0310673 A1 | 12/2011 | Cho | |
| 2012/0039130 A1 | 2/2012 | Yoon | |
| 2012/0069667 A1 | 3/2012 | Shirakawa | |
| 2012/0195120 A1 | 8/2012 | Iwai | |
| 2014/0254263 A1 | 9/2014 | Avila | |
| 2015/0003150 A1 | 1/2015 | Aritome | |
| 2017/0148814 A1 | 5/2017 | Rhie | |

FOREIGN PATENT DOCUMENTS

| | | |
|---|---|---|
| JP | 2011-253609 | 12/2011 |
| JP | 2012-69200 | 4/2012 |

OTHER PUBLICATIONS

Taiwanese Office Action issued Nov. 12, 2015 in Patent Application No. 102131689 (w/English language translation).
Office Action issued Mar. 28, 2016 in Taiwanese Patent Application No. 102131689 (w/English language translation).

* cited by examiner

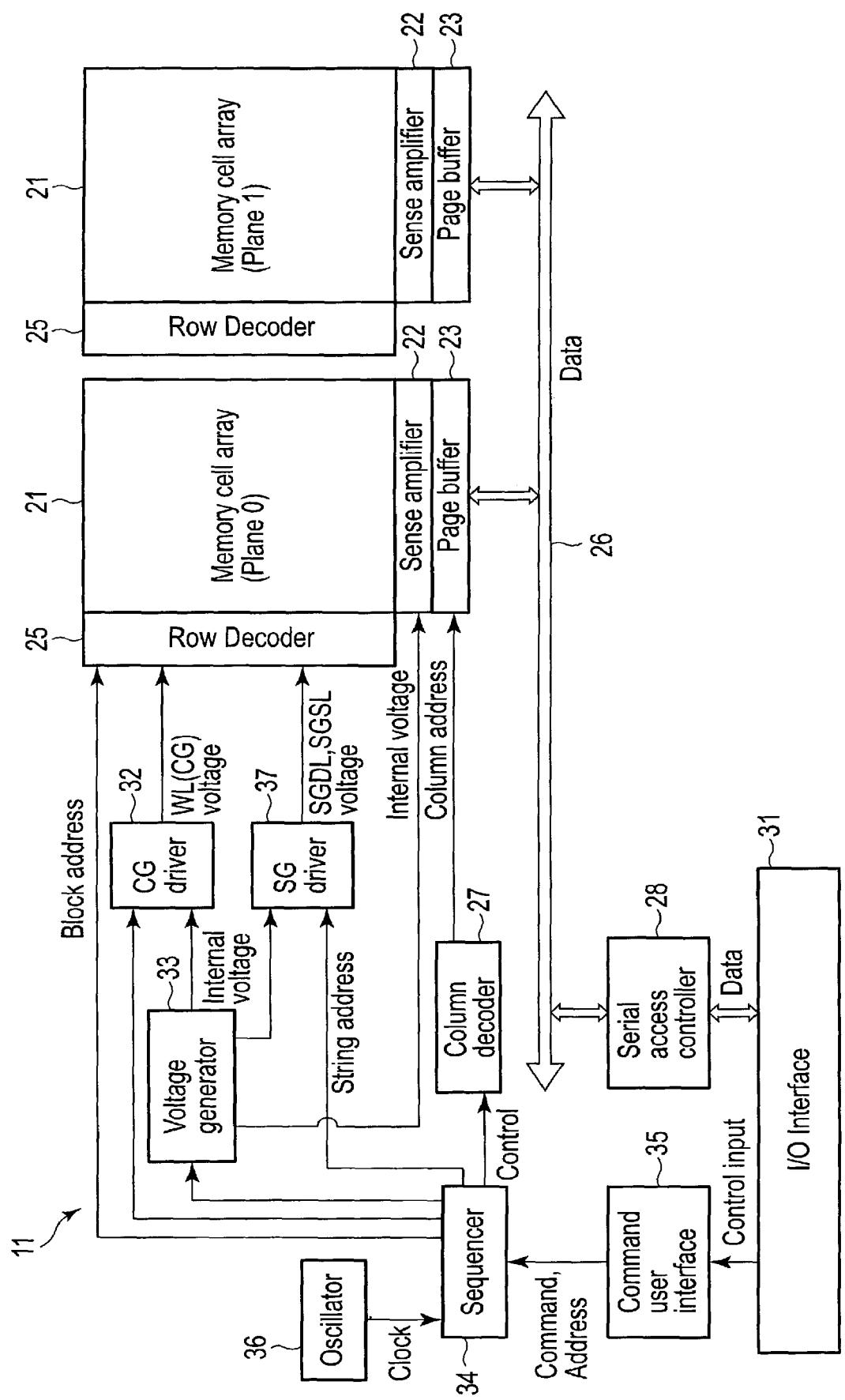
F I G. 2

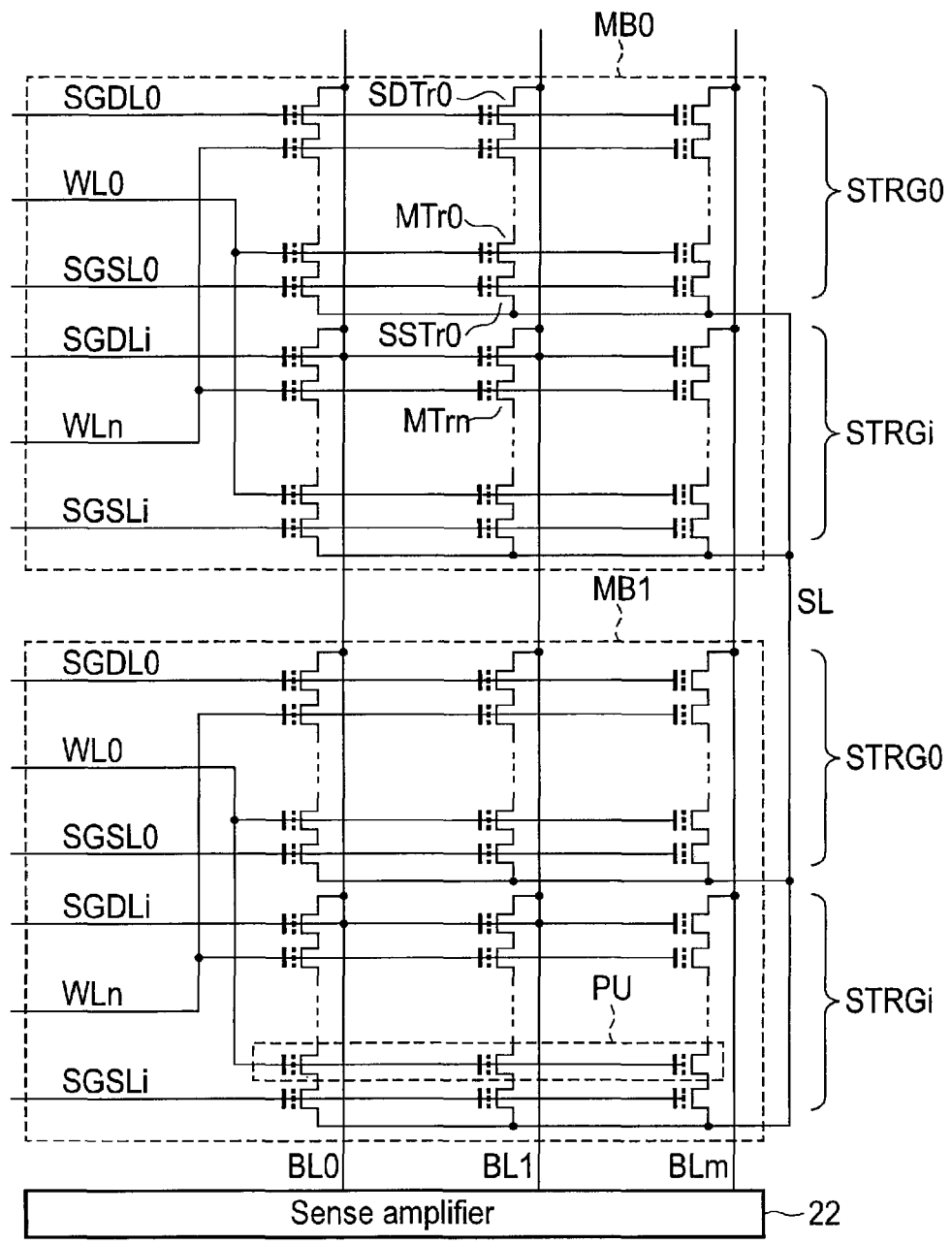
F I G. 4

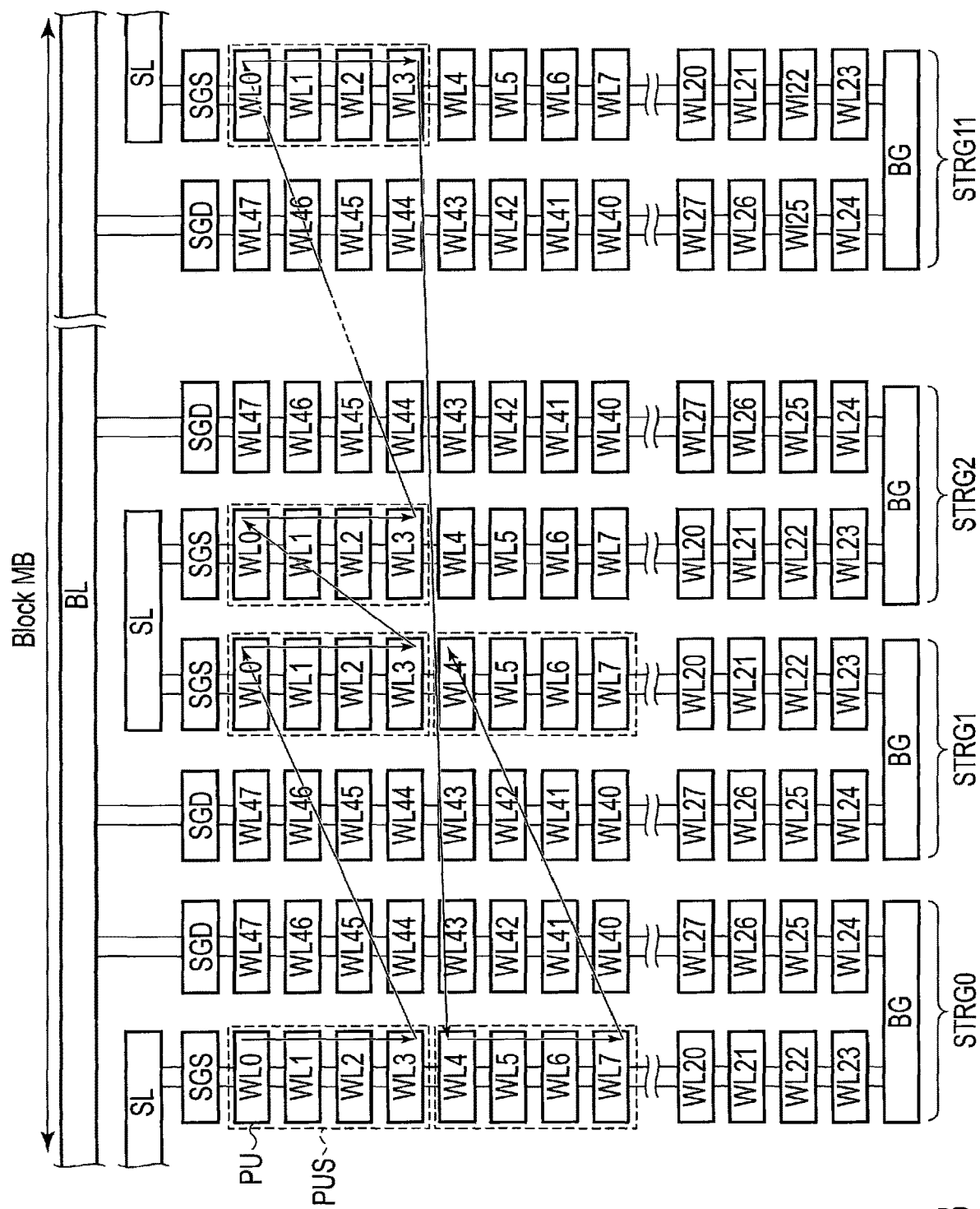
F I G. 8

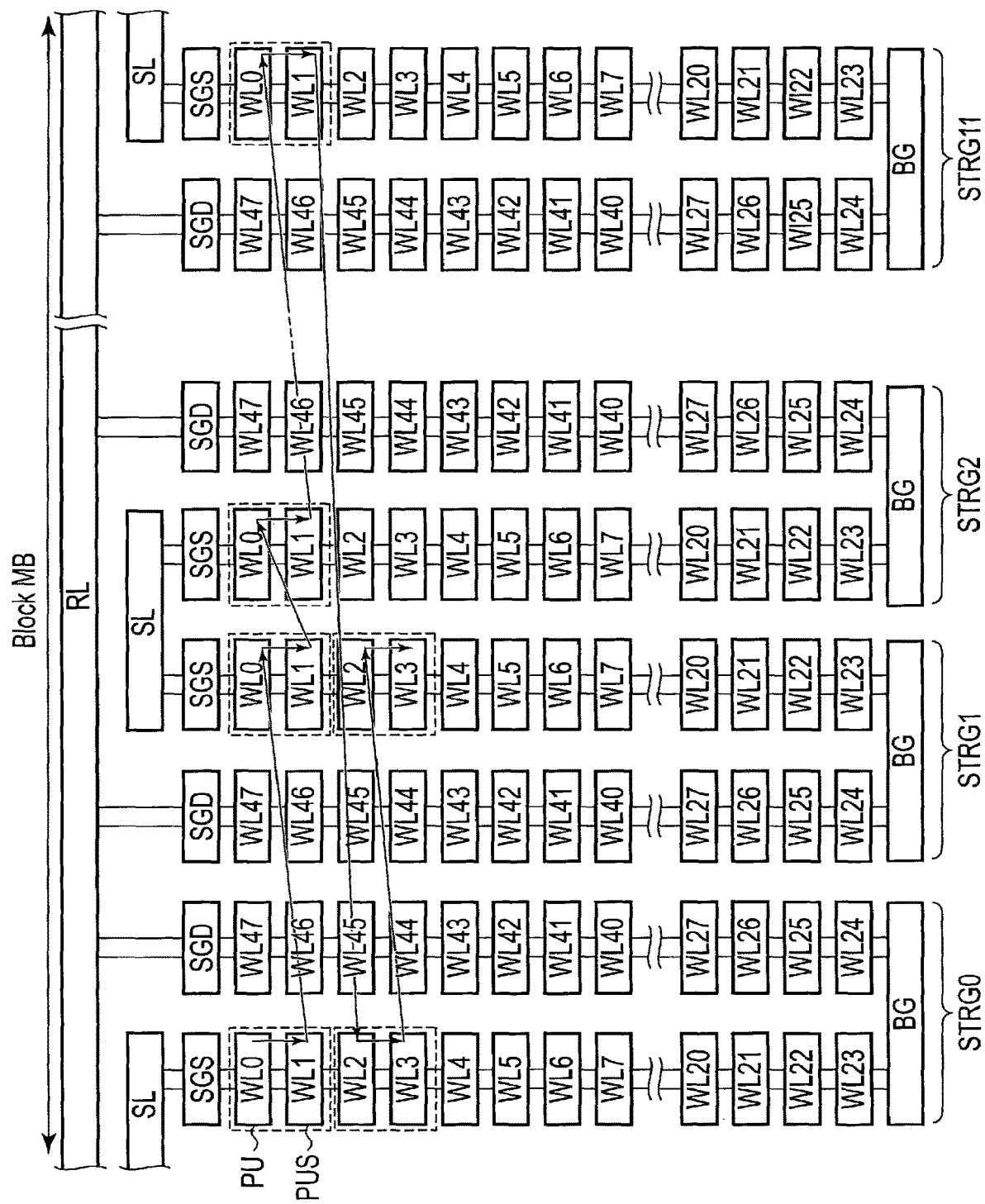
F I G. 9

MEMORY SYSTEM INCLUDING SEMICONDUCTOR MEMORY AND CONTROLLER

This application is a continuation of and claims the benefit of priority under 35 U.S.C. § 120 from U.S. application Ser. No. 17/381,248 filed Jul. 21, 2021, which is a continuation of U.S. application Ser. No. 17/101,029 filed Nov. 23, 2020 (now U.S. Pat. No. 11,100,999 issued Aug. 24, 2021), which is a continuation of U.S. application Ser. No. 16/656,673 filed Oct. 18, 2019 (now U.S. Pat. No. 10,878,913 issued Dec. 29, 2020), which is a continuation of U.S. application Ser. No. 16/045,956 filed Jul. 26, 2018 (now U.S. Pat. No. 10,490,282 issued Nov. 26, 2019), which is a continuation of U.S. application Ser. No. 15/230,857 filed Aug. 8, 2016 (now U.S. Pat. No. 10,062,438 issued Aug. 28, 2018), which is a continuation of U.S. application Ser. No. 14/200,641 filed Mar. 7, 2014 (now U.S. Pat. No. 9,431,112 issued Aug. 30, 2016), and claims the benefit of priority of U.S. Provisional Application No. 61/861,456 filed Aug. 2, 2013, the entire contents of each of which are incorporated herein by reference.

FIELD

Embodiments of the present invention relate to a semiconductor memory device.

BACKGROUND

Three-dimensional structure memories with stacks of memory cells are known.

BRIEF DESCRIPTION OF THE DRAWINGS

FIG. 2 is a block diagram of a memory according to the first embodiment.

FIG. 4 is a circuit diagram of a part of the memory cell array according to the first embodiment.

FIG. 8 illustrates a write sequence in the memory device according to the first embodiment.

FIG. 9 illustrates a second example of a write sequence in the memory device according to the first embodiment.

DETAILED DESCRIPTION

According to one embodiment, a controller controls a memory. The memory comprises first strings coupled to respective bit lines and second strings respectively coupled to the bit lines. Each of the first and second strings comprises memory cell transistors coupled in series. The first strings configure a first string group, and the second strings configure a second string group. In each string group, a set of memory cell transistors each from each string configures a unit. The controller is configured to write data per unit. The controller is further configured to: sequentially write, in the first string group, data in first units to which serially-coupled memory cell transistors respectively belong; sequentially write, in the second string group, data in first units to which serially-coupled memory cell transistors respectively belong; and sequentially write, in the first string group, data in second units to which serially-coupled memory cell transistors respectively belong. The first units of the first string group are different from the second units.

First Embodiment

Embodiments will now be described with reference to the figures. Components with substantially the same functionality and configuration will be referred to with the same reference number and duplicate descriptions will be made only when required. It should be noted that the figures are schematic. The following embodiments only illustrate devices and methods for embodying the technical idea of the embodiments, and the technical idea of the embodiments does not limit the material, form, structure, and arrangement, and the like, of components to the following examples. The technical idea of the embodiments may be variously changed in accordance with the scope of the claims.

Each functional block can be implemented as hardware, computer software, or a combination of the both. For this reason, in order to clearly illustrate this interchangeability of hardware and software, descriptions will be made in terms of their functionality in general. Moreover, it is not essential that each functional block is distinguished as the following examples. For example, some of the functions may be implemented by functional blocks different from those illustrated below. Furthermore, an illustrated functional block may be divided into functional sub-blocks.

Figure 1:
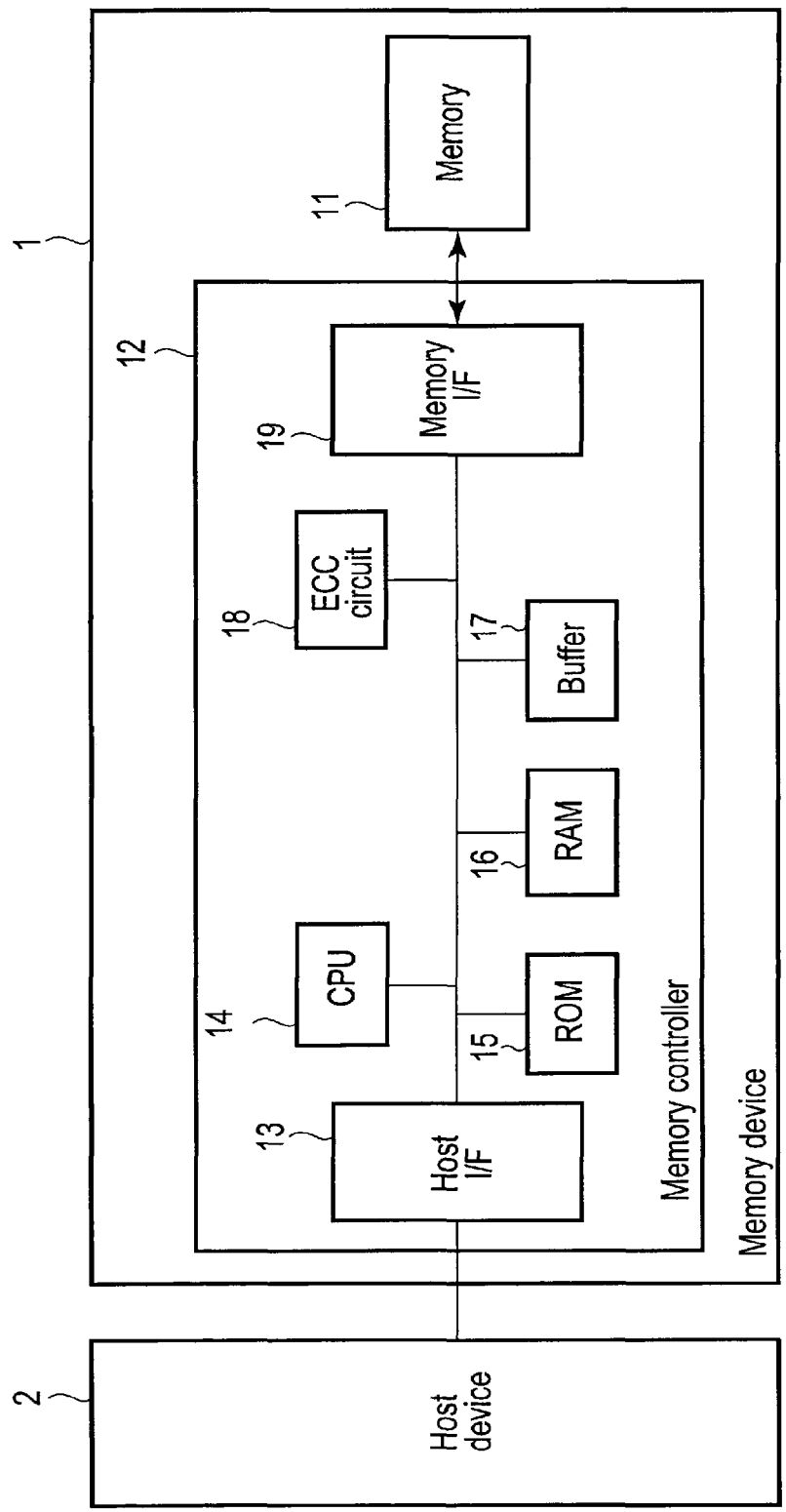
FIG. 1 is a block diagram of a memory device according to a first embodiment.

FIG. 1 is a block diagram of a memory device according to the first embodiment. The memory device 1 includes a semiconductor memory 11 and a memory controller 12. The memory device 1 is an SD card, for example. The memory device 1 communicates with a host device 2.

The memory controller 12 receives, for example, write commands and read commands from the host device 2, and accesses the memory 2 in accordance with the commands. The memory controller 12 includes a host interface (I/F) 13, a central processing unit (CPU) 14, a read only memory (ROM) 15, a random access memory (RAM) 16, a buffer 17, an error correction circuit (ECC circuit) 17 and a memory interface 19. They are coupled by a bus.

The host interface 13 allows the memory device 1 to be interfaced with the host device 2. The CPU 14 manages operation of the whole memory device 1 in accordance with control programs. The ROM 15 stores firmware, such as control programs used by the CPU 14. The RAM 16 is used as a work area for the CPU 14, and stores, for example, control programs and various kinds of tables. The buffer 17 temporarily stores data.

The ECC circuit 18 includes an ECC encoder and an ECC decoder. The ECC encoder generates error correction codes for parities from received data in accordance with predetermined rules for producing error correction codes. The ECC decoder corrects an error or errors of data in accordance with received data and its parities.

The memory interface 19 allows the memory controller 12 to be interfaced with the memory 11.

FIG. 2 illustrates a block diagram of the memory 11 according to the first embodiment. As shown in FIG. 2, the memory 11 includes components such as memory cell arrays 21, sense amplifiers 22, page buffers 23, a row decoder 25, a data bus 26, a column decoder 27, a serial access controller 28, an I/O interface 31, a CG driver 32, a voltage generator 33, a sequencer (or controller) 34, a command user interface 35, an oscillator 36 and SG drivers 37. The memory 11 corresponds to one semiconductor chip, for example.

The memory 11 includes multiple memory cell arrays 21. FIG. 1 illustrates two memory cell arrays 21; however the memory 11 may include three or more memory cell arrays 21. Each memory cell array 21 includes memory blocks, which may be simply referred to as blocks hereinafter. Each block has strings. Each string includes serially-coupled memory cell transistors and two select gate transistors at both ends thereof. Multiple strings are coupled to a bit line. Specific multiple memory cell transistors share a word line. Memory cell transistors which share a word line configure a physical unit. The memory space of one physical unit configures one or more pages. Data is read per page and erased per block. When the memory 11 is configured to store data of two or more bits per memory cell, two or more pages are assigned to the memory space of one physical unit. In this case, a write may be executed per page in one physical unit, or together in some or all pages in one physical unit. In order to encompass any scenario, the following description will be made with a physical unit used as a write unit. The memory cell array 21 has a three-dimensional structure, which will be described later in detail.

A set of the sense amplifier 22, page buffer 23, and row decoder 25 is provided for each memory cell array 21. Each sense amplifier 22 includes sense amplifier units coupled to respective bit lines, and senses and amplifies the potential on the bit lines. Each page buffer 23 receives a column address, reads data from the specified memory cell transistors in accordance with the column address, temporarily stores the read data, and outputs it to the data bus 26, during a read. Each page buffer 23 receives data from outside the memory 11 through the data bus 26 in accordance with the column address and temporarily stores the received data during a write. The column address is supplied by the column decoder 27.

The data bus 26 is coupled to the serial access controller 28. The serial access controller 28 is coupled to the I/O interface 31. The I/O interface 31 includes signal terminals, communicates with the memory interface 19 of the memory controller 12, and allows the memory 11 to be interfaced with the memory controller 12. The serial access controller 28 performs control including translation between a parallel signal on the data bus 26 and a serial signal flowing through the I/O interface 31.

Each row decoder 25 receives a block address from the sequencer 34 and selects a block in accordance with the received block address. Specifically, each row decoder 25 is coupled to the CG driver 32, and couples outputs of the CG driver 32 to a selected block. The CG driver 32 receives voltages from the voltage generator 33, and, in accordance with control by the sequencer 34, generates voltages required for various operations of the memory 11 such as a read, write, and erase. The CG driver 32 is shared by the planes. The voltages output from the CG driver 32 are applied to the word lines.

An SG driver 37 is provided for each plane. Each SG driver 37 receives a string address from the sequencer 34, and selects a string in accordance with the received string address. Specifically, each SG driver 37 receives voltages from the voltage generator 33, and outputs the voltages only for a selected string. The voltages output from the SG driver 37 are applied to select gate lines (or gate electrodes of select gate transistors).

The voltage generator 33 also provides the sense amplifier 22 with voltages required for its operation. The sequencer 34 receives signals, such as a command and an address, from the command user interface 35, and operates in accordance with a clock from the oscillator 36. The sequencer 34 controls various components (functional blocks) in the memory 11 in accordance with the received signal. For example, the sequencer 34 controls the column decoder 27, CG driver 32, voltage generator 33 and SG drivers 37 in accordance with the received signals, such as the command and address. Moreover, the sequencer 34 outputs the aforementioned block address and string address in accordance with the received signals, such as the command and address. The command user interface 35 receives a control signal via the I/O interface 31. The command user interface 35 decodes the received control signal, and obtains commands and addresses, and the like.

The memory 11 may be configured to store data of two or more bits in one memory cell.

Figure 3:
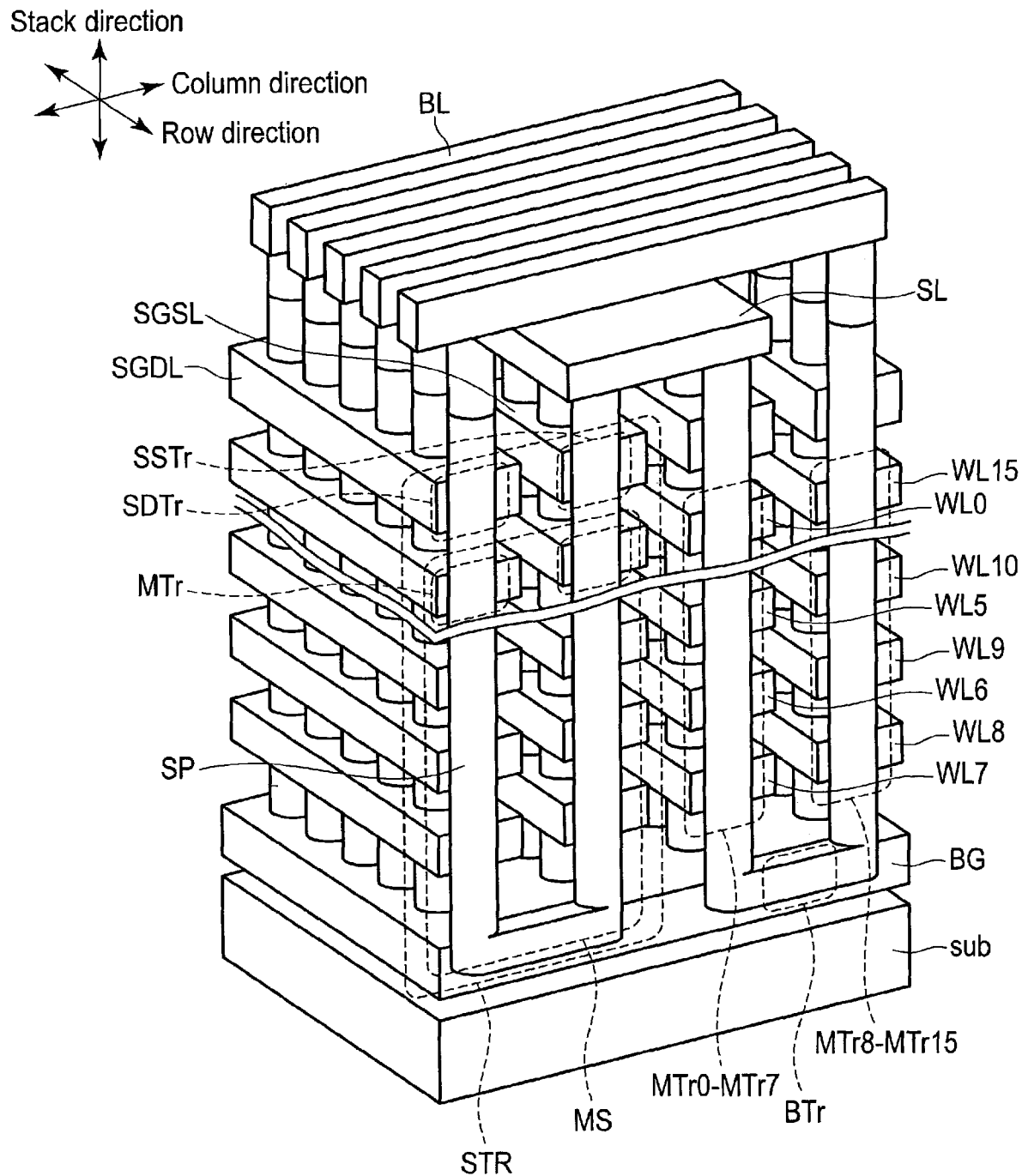
FIG. 3 is a perspective view of a part of a memory cell array according to the first embodiment.

The memory cell array 21 has components and connections illustrated in FIGS. 3 and 4. FIG. 3 is a perspective view of the memory cell array according to the first embodiment. FIG. 4 is a circuit diagram of a part (i.e., two physical blocks MB) of the memory cell array according to the first embodiment. As illustrated in FIGS. 3 and 4, the memory cell array 21 has bit lines BL, source (cell source) lines SL, and physical blocks MB. The source lines SL extend along the row direction. The bit lines BL extend along the column direction. The row and column directions cross each other at right angles. The physical blocks MB are in a line along the column direction at predetermined intervals. In each physical block MB, i+1 (i being 11, for example) strings STR are coupled to one bit line BL.

A string STR has a memory string MS, a source-side select gate transistor SSTr, and a drain-side select gate transistor SDTr. Memory strings MS are located above a substrate sub along the stack direction. A memory string MS includes n+1 memory cell transistors (an example of n=15 is illustrated and described) MTr0 to MTr15 and a back gate transistor BTr which are serially coupled. When reference numerals with a subscript (for example, cell transistors Mtr) do not need to be distinguished from each other, a reference numeral without the subscript is used, and this refers to all reference numerals with subscripts. The cell transistors MTr0 to MTr7 are located in the described order toward the substrate sub along the stack direction. The cell transistors MTr8 to MTr15 are located in the described order away from the substrate sub along the stack direction. The cell transistors MTr include a semiconductor pillar SP, an insulator on the surface of the semiconductor pillar SP, and respective word lines (or control gates) WL as will be described in detail later. A back gate transistor BTr is coupled between bottom cell transistors MTr7 and MTr8.

The select gate transistors SSTr and SDTr are located above top cell transistors MTr0 and MTr15 along the stack direction, respectively. The drain of a transistor SSTr is coupled to a source of a cell transistor MTr0. The source of a transistor SDTr is coupled to a drain of a cell transistor MTr15. The source of a transistor SSTr is coupled to the source line SL. The drain of a transistor SDTr is coupled to a bit line BL.

Strings located in a line along the row direction configure a string group STRG. For example, all strings located in a line along the row direction and respectively coupled to all bit lines BL configure a string group STRG. In each string group STRG, the strings have their respective gates of the cell transistors MTr0 commonly coupled to the word line WL0. Similarly, in each string group STRG, the strings have their respective gates of cell transistors MtrX commonly coupled to a word line WLX. The word lines WL extend along the row direction. Respective gates of the back gate transistors BTr are commonly coupled to a back gate line BG.

In each string group STRG, the strings STR have their respective gates of the transistors SDTr commonly coupled to a drain-side select gate line SGDL. In each string group STRG, the strings STR have their respective drains of the respective transistors SDTr coupled to respective bit lines BL. The select gate lines SGDL extend along the row direction. The string groups STRG0 to STRGi are provided with select gate lines SGDL0 to SGDLi, respectively.

In each string group STRG, the strings STR have their respective gates of the transistors SSTr commonly coupled to a source-side select gate line SGSL.

Respective sources of transistors SSTr from two strings STR located in a line along the column direction are coupled to the same source line SL. In each string group STRG, the strings STR have their respective sources of the transistors SSTr coupled to the same source lines SL. The select gate lines SGSL and source line SL extend along the row direction. The string groups STRG0 to STRGi are provided with select gate lines SGSL0 to SGDLi, respectively.

Cell transistors of strings which are in one string group STRG and coupled to the same word line WL configure a physical unit PU.

In each block MB, the word lines of the same number from different strings are coupled to each other. Specifically, word lines WL0 of all strings in one block MB are coupled to each other, and word lines WLX are coupled to each other, for example.

For access to a cell transistor MTr, one block MB is selected and one string group STRG is selected. For selecting one block, a signal to select a block MB is output to only a block MB specified by a block address signal. With such a block select signal, in the selected block MB, the word lines WL and select gate lines SGSL and SGDL are coupled to drivers.

Furthermore, for selecting one string group STRG, select transistors SSTr and SDTr only in a selected string group STRG receive voltages for the purpose of selection. In unselected string groups STRG, select-transistors SSTr and SDTr receive voltages for the purpose of non-selection. The voltages for selection depend on operations such as read and write. The voltages for non-selection also depend on operations such as read and write.

Figure 5:
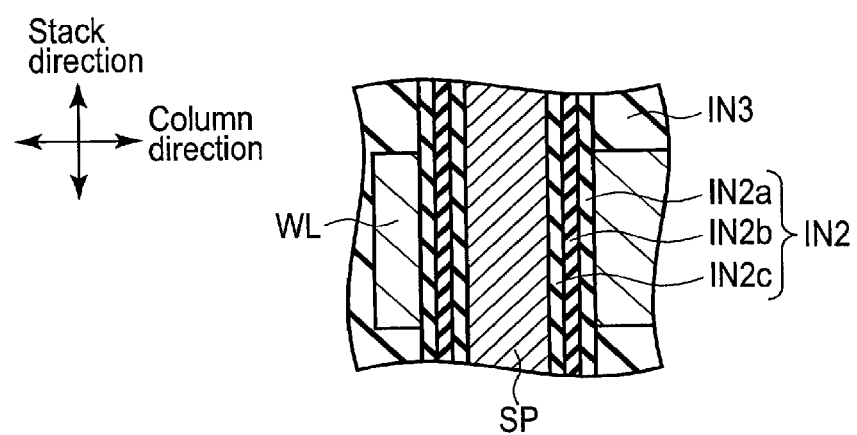
FIG. 5 is a sectional view of a memory cell transistor according to the first embodiment.

Each cell transistor MTr has a structure illustrated in FIG. 5, for example. FIG. 5 is a sectional view of a cell transistor according to the first embodiment. The word lines (or gates) WL are made of polysilicon or a polycide, for example. A hole is formed through the word lines WL and insulators therebetween. On the surface of the hole, insulator IN2 is formed, and the semiconductor pillar SP is formed in the hole. The semiconductor pillars SP extend along the stack direction, are arranged in a matrix along a plane formed of the row and column directions, and are made of an impurity-doped semiconductor such as silicon.

The insulator IN2 includes a tunnel insulator IN2a, a charge storage layer IN2b, and an inter-electrode insulator IN2c. The tunnel insulator IN2a comprises silicon oxide ($SiO_2$), for example. The charge storage film IN2b is on the tunnel insulator IN2a. The electric charge insulator IN2b stores electrical charge, and comprises silicon nitride (SiN), for example. The inter-electrode insulator IN2c is on the charge storage layer IN2b. The inter electrode insulator IN2c comprises silicon oxide, for example. A cell current flowing through the semiconductor pillar SP varies based on the potential of a word line WL and the number of carriers in the charge storage layer IN2b, which is utilized by the cell transistor MTr to store data in a nonvolatile manner.

Figure 6:
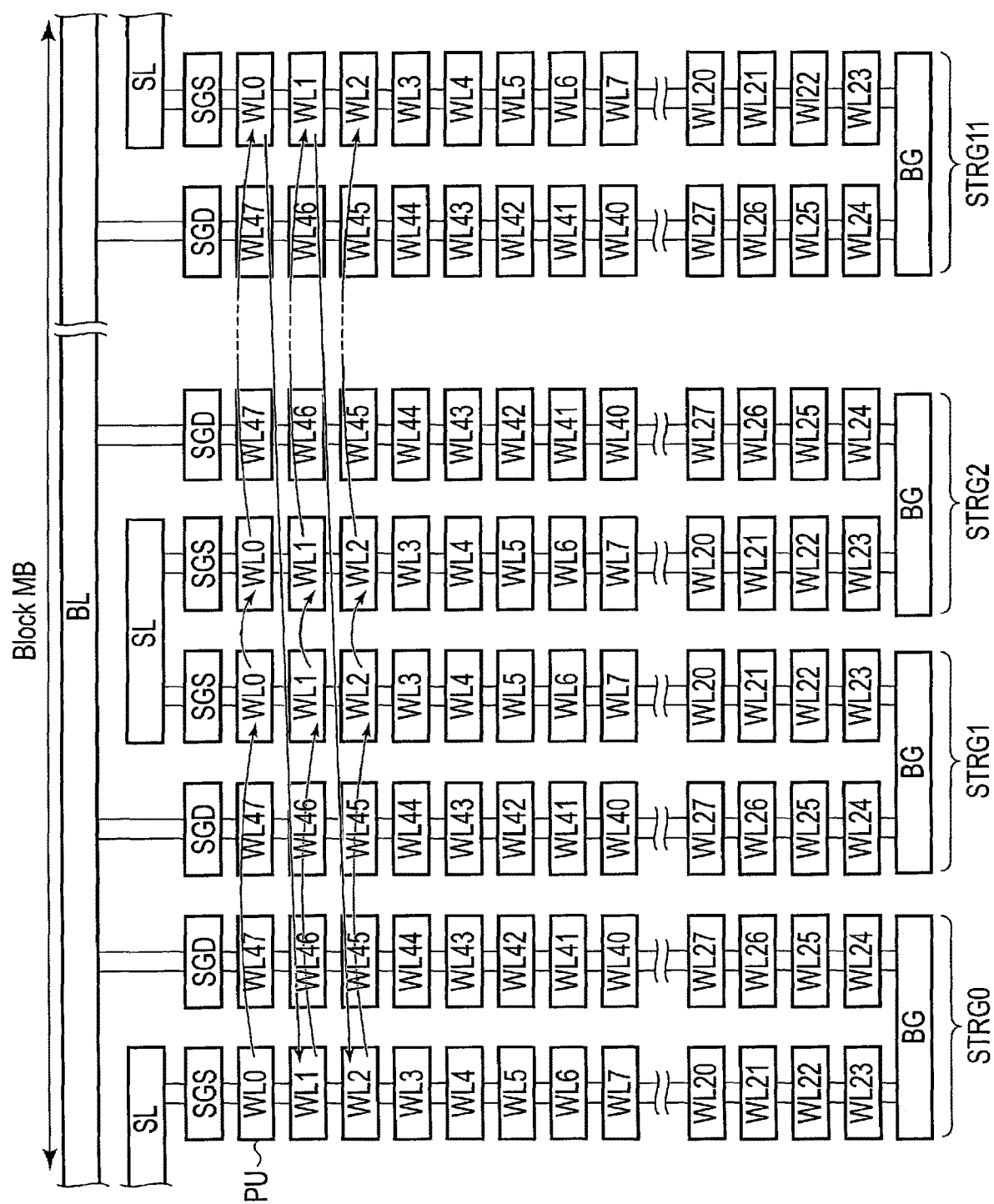
FIG. 6 illustrates a first example of a possible write sequence.
Figure 7:
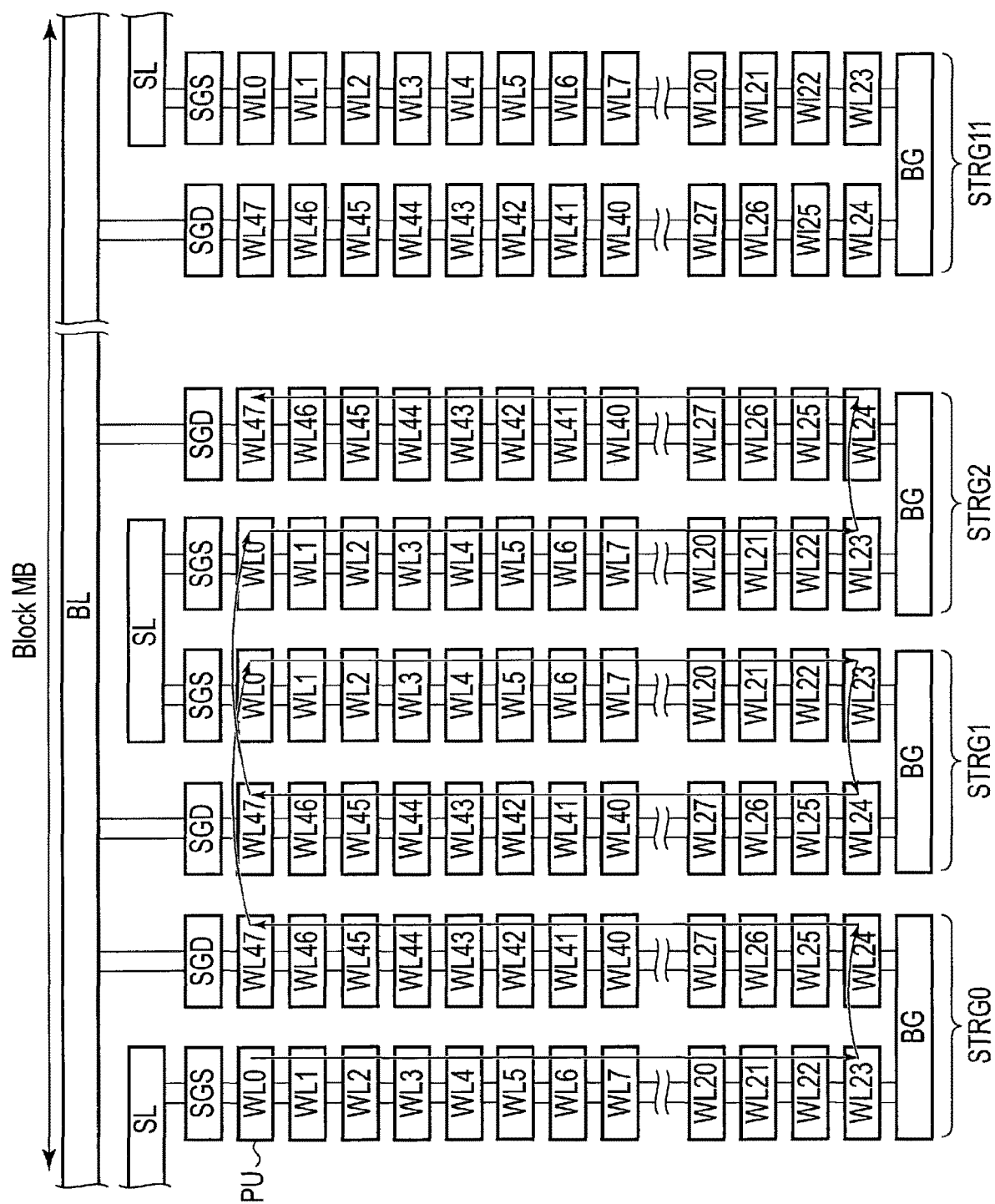
FIG. 7 illustrates a second example of a possible write sequence.

As a write to one block MB in the memory 11 with components and connections as in FIGS. 3 to 5, the following two kinds of methods are generally possible. FIGS. 6 and 7 illustrate first and second examples of possible write sequences, respectively. FIGS. 6 and 7 both illustrate an example with one memory string MS including forty-eight memory cell transistors MTr and one block MB including twelve string groups STRG0 to STRG11. In the FIG. 6 example, a write to one physical unit PU per one string group STRG is repeated to all string groups STRG in one block MB, and such a write set is repeated to other physical units PU. Specifically, a write to a physical unit PU formed by memory cell transistors MTr coupled to its word line WL0 (referred to as a physical unit PU of the word line WL hereinafter) is repeated in ascending order of strings STRG, and such a write set is repeated from the physical unit of word line WL1 in ascending order of the word lines. Such a write method is referred to as a word-line order write herein.

In contrast, in the example of FIG. 7, writes conclude for every string STRG. Specifically, in each string STRG, a write is repeated in ascending order from the physical unit PU of the word line WL0 toward that of the word line WL47, and this write set is repeated in ascending order from the string STRG0 toward STRG11. Such a write method is referred to as a string-group order write herein.

The word-line order write is said to be robust against influences from a write disturb and to maintain the quality of written data. The word-line order write, however, has the following problems. As described above, the ECC circuit 18 calculates codes for correcting errors of data to be written (or write data) into the memory 11 from outside the memory device 1. In the word-line order write, an error correction code will be calculated in accordance with write data which will be stored in physical units PU of all word lines WL assigned the same number in one block MB. When such calculation of error correction code is executed with cross-interleave methods such as the cross-interleave Reed-Solomon code method applied, it requires the RAM 16 to have a large capacity. This is because the same-numbered word lines WL in one block are coupled to each other and a defect in one word line WL influences all string groups STRG in that block MB, and therefore it is necessary to assume the size of whole data in word-line-sharing physical units PU to be an error burst. Such a case in turn requires a large-size correction code for error correction.

In contrast, in the string-group order write, an error correction code will be calculated from write data which will be stored in all physical units PU in one string group STRG. Such a calculation of code requires the RAM 16 with a small capacity. It is because influence of a defect in a particular word line WL only extends, at the farthest, to the adjacent word lines WL are restrictive, and therefore can be easily corrected with data in physical units of other word lines WL. The string-group order write, however, produces a larger write disturb than the word-line order write, and therefore may deteriorate the quality of written data. Thus, any write has a trade-off relation between the data quality and required RAM size.

FIG. 8 illustrates a write sequence in the memory device according to the first embodiment, and illustrates a sectional view of one memory block MB. FIG. 8 illustrates an example with one memory string MS including forty-eight memory cell transistors MTr. The memory controller 12 is configured so that it can execute the write sequence as illustrated in FIG. 8 and described as follows. Specifically, the memory controller 12 stores program which, when executed, causes the CPU 14 to execute the following operations, in ROM 15, for example.

In the following description, in each string group, the physical unit PU of word line WL0 is referred to as physical-unit PU0. Similarly, in each string group, the respective physical units PU of word lines WL1 to WL47 are referred to as physical units PU1 to PU47, respectively.

When the memory controller 12 receives a write command from the host device 2, it writes write data in the memory 11 in accordance with the following sequence. Specifically, the memory controller 12 first writes data in physical units PU of a predetermined number (to be described in detail later) of the smallest-numbered string STRG0 in ascending order of the numbers of the physical units PU including the smallest-numbered physical unit PU0. More specifically, the string group STRG0 is selected for writes, and word lines of the predetermined number from the word line WL0 are sequentially selected for writes. Such physical units PU sequentially written in one string group STRG are referred to as a physical-unit set PUS. A physical-unit set PUS includes at least two physical units PU, and includes four physical units PU, for example. With the example of four, the physical unit set PUS0 including the smallest-numbered physical unit PU0 includes physical units PU0 to PU3. In FIG. 8 and following figures, each physical-unit set PUS is illustrated as a set of physical units PU of word lines WL surrounded by a dashed line.

To the data to be written in the physical unit set PUS0, an error correction code generated by the ECC circuit 18 is added. The ECC circuit 18 follows the control by the control program which manages the operation of the whole memory controller 12 (or the CPU 14 operating in accordance with the control program) to generate a set of write data and error correction code to correct errors therein for each physical unit set PUS. Specifically, the memory controller 12 prepares data input to the ECC circuit 18 (or ECC encoder input) so that the size of the data with an error correction code added has a size smaller than or equal to that of the physical unit PUS. Then, in accordance with the ECC encoder input of such a size, the ECC circuit 18 generates an error correction code, and outputs the set of the ECC encoder input and error correction code (or ECC encoder output). The memory controller 12 then writes the obtained ECC encoder output in the physical unit set PUS0 in ascending order of the numbers of its physical units PU. Generation of the error correction code for the data to be written in the physical unit set PUS0 requires a RAM size smaller than would be necessary to generate an error correction code in the word-line order write.

The memory controller 12 then repeats a similar write executed to the string group STRG0 to the string group STRG1, which has the second smallest number. Specifically, the memory controller 12 writes an ECC encoder output of the size smaller than or equal to that of the physical unit set PUS in the physical unit set PUS0 of the string group STRG1, which are specifically physical units PU0 to PU3, in ascending order of the numbers of the physical units PU. Furthermore, the memory controller 12 repeats the write executed to the string groups STRG0 or STRG1 to remaining string groups STRG in one block MB in ascending order of the numbers of the string groups STRG. Specifically, the memory controller 12 writes ECC encoder outputs in the physical-unit sets PUS0 (physical units PU0 to PU3) in order from the string group STRG2 toward the largest-numbered string group (or, string group STRG 11 in the current example).

Thus, the memory controller 12 first repeats writes to the smallest-numbered physical unit sets PUS0 while traversing all string groups STRG in one block MB.

Then, the memory controller 12 similarly repeats writes to the physical unit sets PUS1 while traversing all string groups STRG in one block MB in ascending order of the numbers of the string groups STRG. The physical unit set PUS1 differs from the physical unit set PUS0. The physical unit set PUS1 typically succeeds the physical unit set PUS0. Specifically, the physical unit set PUS1 is a set of consecutive physical units PU of the predetermined number succeeding the largest-numbered physical unit PU of the physical unit PUS0. For example, the physical unit set PUS1 includes as many physical units PU as in the physical-unit set PUS0. Following the ongoing context, the physical unit PUS1 includes physical units PU4 to PU7. Writes in the physical-unit set PUS1 occur in ascending order of the numbers of physical units PU.

Similarly, the memory controller 12 also repeats writes to one physical unit set PUS per one string group STRG while traversing all string groups STRG in one block MB, to the remaining physical unit sets PUS. Specifically, all physical units PU in each string group STRG are divided into physical unit sets PUS, and the writes to one physical unit set per string group STRG are repeated while traversing string groups in ascending order of the numbers of the physical unit sets PUS. Each physical unit set PUS typically includes physical units PU of the same number. Thus, the writes to all physical units PU of all string groups STRG in one block finish.

A physical unit set PUS may include more or less than four physical units PU. For example, a physical unit set PUS includes eight physical units PU. FIG. 9 illustrates such an example, illustrates a second example of a write sequence in the memory device according to the first embodiment, and illustrates a sectional view of one block MB. FIG. 9 also illustrates an example of one memory string MS including forty-eight memory cell transistors MTr.

As illustrated in FIG. 9, each physical unit set PUS includes consecutive physical units PU respectively assigned two sequential numbers. The memory controller 12 repeats writes to physical unit set PUS0 including the physical units PU0 and PU1 while traversing all string groups STRG in one block MB. Similarly, all physical units PU in each string group STRG are divided into physical unit sets PUS including two physical units, and the writes to one physical unit set per string group STRG are repeated while traversing string groups in ascending order of the numbers of the physical unit sets PUS.

Figure 10:
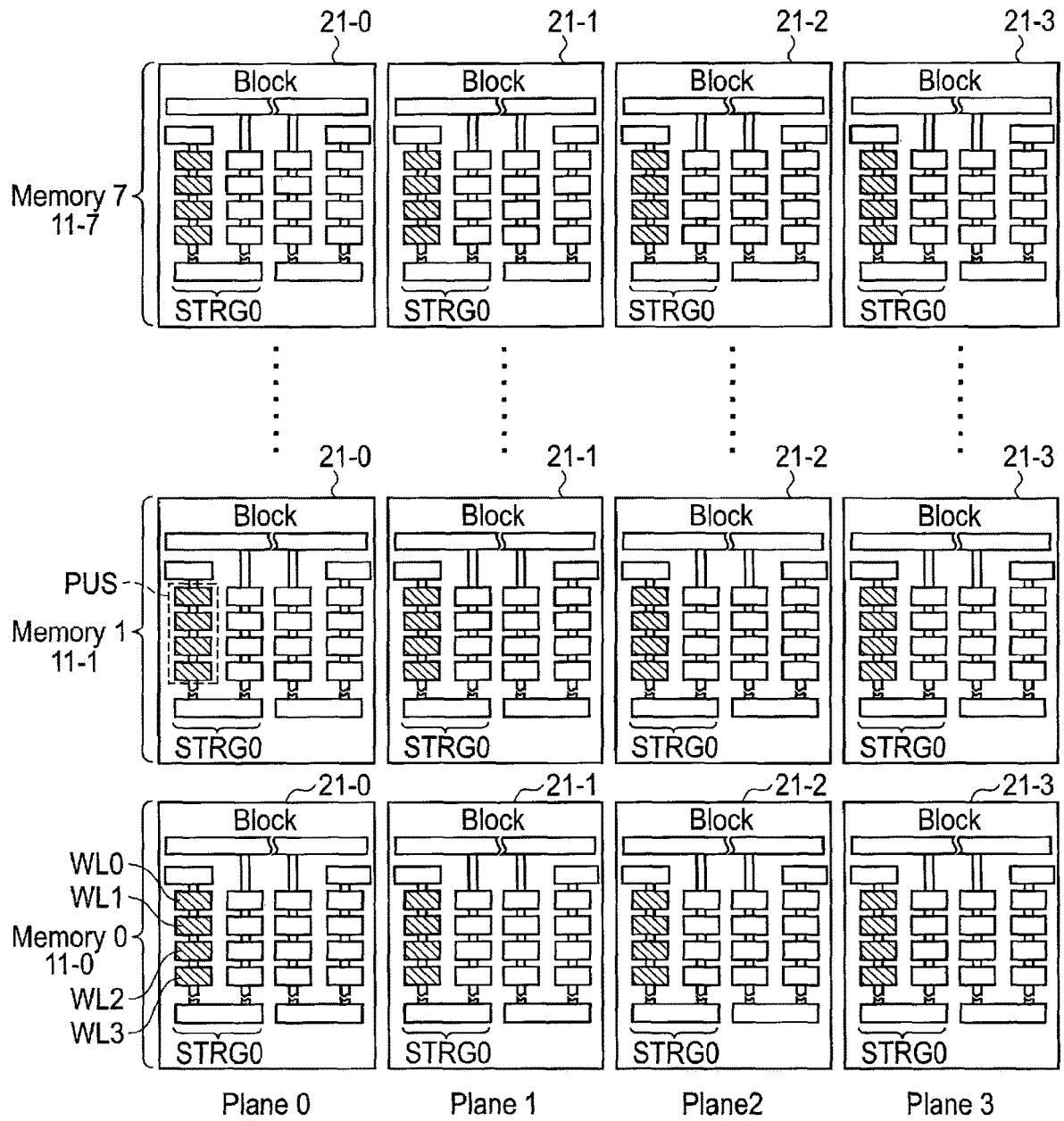
FIG. 10 illustrates a third example of a write sequence in the memory device according to the first embodiment.
Figure 11:
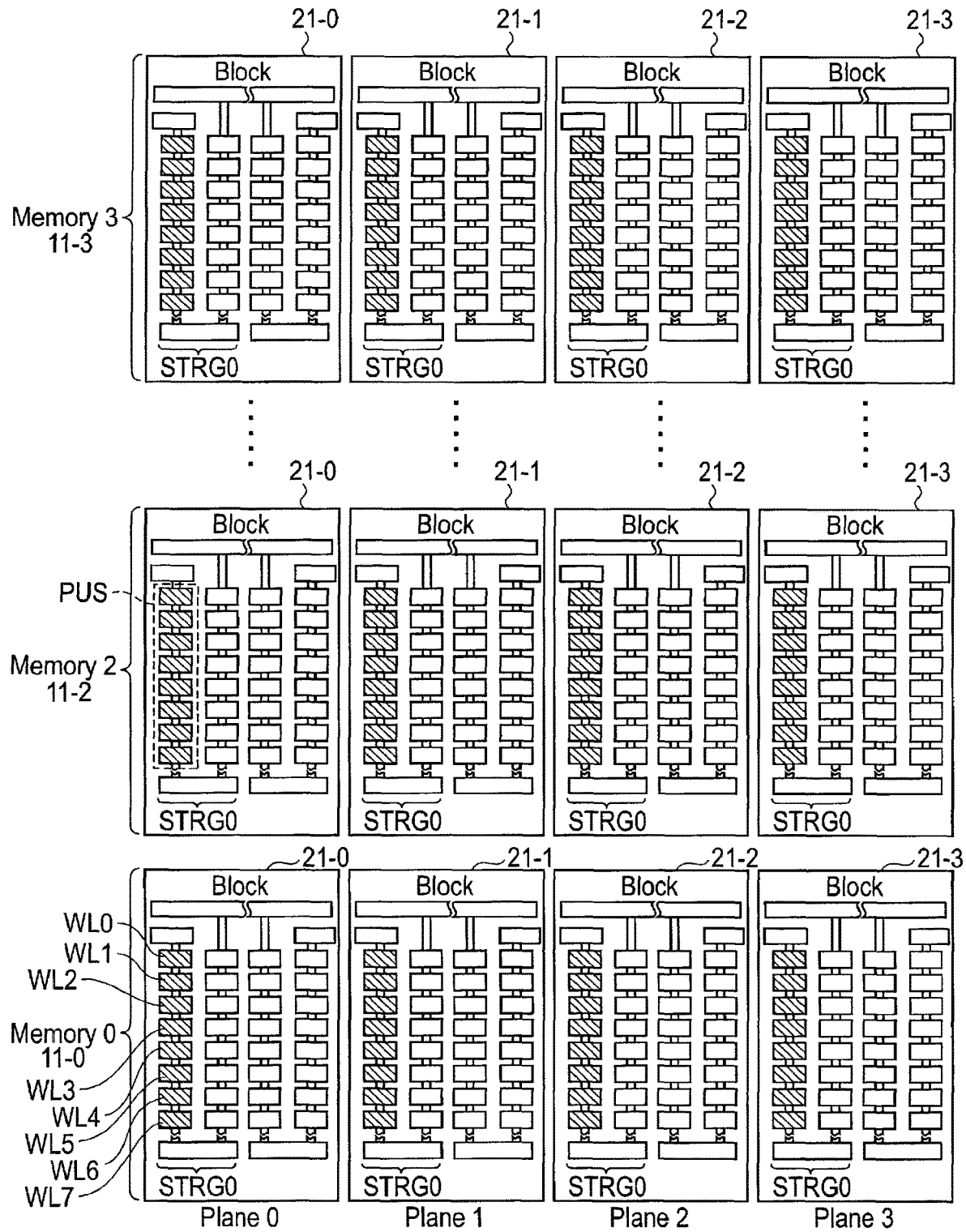
FIG. 11 illustrates a fourth example of a write sequence in the memory device according to the first embodiment.

An ECC encoder input may extend over multiple planes and multiple chips. FIGS. 10 and 11 illustrate such examples, and illustrate third and fourth examples of a write sequence in the memory device according to the first embodiment. FIGS. 10 and 11 only illustrate one block MB from each plane 21. In FIGS. 10 and 11, physical units which configure a physical unit set PUS are illustrated shaded.

In the FIG. 10 example, the memory device 1 includes 0th to seventh memories 11-0 to 11-7, and each memory 11 includes 0th to third planes 21. As illustrated in FIG. 10, the memory controller 12 configures one physical unit set PUS from four physical units PU respectively assigned four sequential numbers from each of the 0th to third planes 21-0 to 21-3 from each of the 0th to seventh memories 11-0 to 11-7. Specifically, one physical unit set PUS consists of physical units PU of 4 (physical units per one string group)×4 (planes)×8 (memories)=128. The memory controller 12 provides the ECC circuit 18 with an ECC encoder input which includes data to be written in the memory 11 and the error correction code and has a size that fits in 128 physical units PUS. Then, a set of the ECC encoder input and error correction code (or, ECC encoder output) of such a size is written in one physical unit set PUS. FIG. 10 illustrates an example where, of the physical-unit sets PUS, the error correction code is written in the physical units PU2 from each of the second and third planes 21-2 and 21-3 of the seventh memory 11-7. Thus, the physical unit set PUS extending over multiple planes 21 and multiple memories is used in order for data to be written as described with reference to FIG. 8. Specifically, a write to one physical unit set per one string group is repeated in ascending order of the numbers of the physical unit sets PUS while traversing the string groups STRG.

The writes can be executed in any manner so long as data is written in the physical units PU in ascending order of their numbers as described with reference to FIG. 8 in each plane 21. Specifically, in each memory 11, the writes to the physical unit sets PUS may be executed in independent planes 21 sequentially, or to all or some planes 21 in parallel. Furthermore, the writes to the physical-unit sets PUS may be executed in independent memories 11 sequentially, or to all or some memories 11 in parallel.

In the FIG. 11 example, the memory device 1 includes 0th to third memories 11-0 to 11-3, and each memory 11 includes the 0th to third planes 21-0 to 21-3. As illustrated in FIG. 11, the memory controller 12 configures one physical unit set PUS from eight physical units PU with the numbers of sequential eight from each of the 0th to third planes 21-0 to 21-3 from each of the 0th to third memories 11-0 to 11-3. Specifically, one physical unit set PUS consists of physical units PU of 8 (physical units per one string group)×4 (planes)×4 (memories)=128. The specific write is the same as that in FIG. 10 with the only difference being in the combination of the physical units which configure a physical unit set.

The memory controller 12 changes the number of the physical units PU per one plane 21 in accordance with the number of the memories 11 and the number of the planes 21 to control so that the size of one physical unit set PUS is constant as in the examples of FIGS. 10 and 11. In the cases of FIGS. 10 and 11, each memory 11 commonly includes four planes 21 while the memory controller 12 controls eight memories 11 for the FIG. 10 case and four memories 11 for the FIG. 11 case. Then, the memory controller 12 includes four physical units PU per one string group STRG in one physical unit PUS in the FIG. 10 example and eight physical units PU in the FIG. 11 example in order for one physical unit PUS to include 128 physical units PU in any of the cases in FIGS. 10 and 11.

As described above, the memory device according to the first embodiment repeats a write to a physical unit set PUS per string group STRG while traversing the string groups STRG, and repeats such a write set to the remaining physical unit sets PUS. A set of write data and its error correction code is generated in units of physical unit sets PUS. For this reason, the RAM 16 is released whenever data to be written in the physical unit set PUS (including the error correction code) is generated. Therefore, the size of the RAM 16 required for generating the error correction code is smaller than that in the word-line order write (see, FIG. 6). This leads to a decrease in the manufacturing cost of the memory device 1. Moreover, a physical-unit set PUS includes fewer physical units PU than all the physical units PU included in one string group STRG. Therefore, data to be written in the memory 11 is robust against the influence of write disturb.

Second Embodiment

In a second embodiment, the memory 11 replaces the memory controller 12 to execute a particular write sequence.

The memory according to the second embodiment has the same configuration (or, components and connections) as in the first embodiment although the memory 11 of the second embodiment is configured to execute the following operations. Specifically, the sequencer 34 controls related components in the memory 11 such as the column decoder 27, CG driver 32 and SG driver 37 to execute the following operations.

The memory 11 has a normal write mode and a mode to write in a particular sequence. In the mode to write in a particular sequence, the memory 11 executes the write sequence described for the first embodiment with reference to FIGS. 8 and 9. Specifically, in the specific sequence write mode, the memory 11, when instructed to write that will end up with data writes to two or more physical units PU, repeats the write to the same-numbered physical unit set PUS while traversing the string groups, and repeats such a write set to remaining physical unit sets PUS as described with reference to FIGS. 8 and 9. For example, assume that the memory 11 receives data write instructions which lead to data writes to two or more physical units PU (for example, data writes to one block MB or a part of a block MB). In response to such instructions, the memory controller 12 does not instruct or manage areas to which the data will be written per physical unit PU, and therefore the memory can write in physical units PU selected by itself. In a typical example, the memory controller 12 instructs writes to one block MB in the memory 11, and does not specify areas in the block MB in which the data will be written, but selection of areas to which the data will be written is left to the memory 11. In such a case, the memory 11 in the specific sequence write mode autonomously executes the writes of the first embodiment.

In the normal write mode, the memory 11 writes data in the addresses which the memory controller specifies to write data.

The selection of the mode is implemented by a command, for example. The memory 11 has multiple modes, including the aforementioned normal write mode and specific sequence write mode. Thus, each mode is specified by the memory controller 12.

As described above, the memory 11 according to the second embodiment repeats a write to a physical unit set PUS per string group STRG while traversing the string groups STRG, and repeats such a write set to remaining physical unit sets PUS as in the first embodiment. This can produce the same advantages as those of the first embodiment. Furthermore, the memory 11 of the second embodiment in the specific sequence write mode writes data in the specific sequence as in the first embodiment without instructions from the memory controller 12. This can reduce the load of the process carried out by the memory controller 12, and increase the flexibility of use of the memory 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host device, the memory system comprising:
   a nonvolatile semiconductor memory device; and
   a controller configured to access the nonvolatile semiconductor memory device based on a command received from the host device, wherein
   the nonvolatile semiconductor memory device includes:
      first and second strings, each of the first and second strings including a plurality of memory cells and a select transistor, the plurality of memory cells being connected in series, the select transistor being electrically connected in series with the memory cells, the memory cells including a first memory cell, a second memory cell, a third memory cell, and a fourth memory cell;
      a bit line electrically connected to the first and the second strings;
   a first select gate line electrically connected to a gate of the select transistor of the first string;
      a second select gate line electrically connected to a gate of the select transistor of the second string;
      a first word line electrically connected to gates of the first memory cell of the first string and the first memory cell of the second string;
      a second word line electrically connected to gates of the second memory cell of the first string and the second memory cell of the second string;
      a third word line electrically connected to gates of the third memory cell of the first string and the third memory cell of the second string; and
      a fourth word line electrically connected to gates of the fourth memory cell of the first string and the fourth memory cell of the second string,
   the controller is configured to perform a first write process, to perform a second write process after the first write process, to perform a third write process after the second write process, and to perform a fourth write process after the third write process, the first write process includes writing data in the first memory cell of the first string and writing data in the second memory cell of the first string after the writing in the first memory cell of the first string,
   the second write process includes writing data in the first memory cell of the second string and writing data in the second memory cell of the second string after the writing in the first memory cell of the second string,
   the third write process includes writing data in the third memory cell of the first string and writing data in the fourth memory cell of the first string after the writing in the third memory cell of the first string, and
   the fourth write process includes writing data in the third memory cell of the second string and writing data in the fourth memory cell of the second string after the writing in the third memory cell of the second string.

2. The memory system according to claim 1, wherein:
   a voltage for selection is applied to the first select gate line when the data are written in the first memory cell of the first string in the first write process,
   the voltage for selection is applied to the second select gate line when the data are written in the first memory cell of the second string in the second write process,
   the voltage for selection is applied to the first select gate line when the data are written in the second memory cell of the first string in the first write process,
   the voltage for selection is applied to the second select gate line when the data are written in the second memory cell of the second string in the second write process,
   the voltage for selection is applied to the first select gate line when the data are written in the third memory cell of the first string in the third write process,
   the voltage for selection is applied to the second select gate line when the data are written in the third memory cell of the second string in the fourth write process,
   the voltage for selection is applied to the first select gate line when the data are written in the fourth memory cell of the first string in the third write process, and
   the voltage for selection is applied to the second select gate line when the data are written in the fourth memory cell of the second string in the fourth write process.

3. The memory system according to claim 1, wherein:
   the first memory cell of the first string is between the select transistor of the first string and the second memory cell of the first string,
   the first memory cell of the first string is between the select transistor of the first string and the third memory cell of the first string,
   the first memory cell of the second string is between the select transistor of the second string and the second memory cell of the second string, and
   the first memory cell of the second string is between the select transistor of the second string and the third memory cell of the second string.

4. The memory system according to claim 1, wherein:
   the first to fourth word lines are located away from the bit line along a stack direction in the nonvolatile semiconductor memory device,
   the first word line is closer to the bit line than the second word line,
   the third word line is closer to the bit line than the fourth word line, and
   the first word line is closer to the bit line than the third word line.

5. The memory system according to claim 1, wherein:
   the second word line is adjacent to the first word line,
   the third word line is adjacent to the second word line, and
   the fourth word line is adjacent to the third word line.

6. The memory system according to claim 1, wherein:
   the nonvolatile semiconductor memory device comprises a block as a unit of data erasing, and
   the block comprises the first and second strings.

7. The memory system according to claim 1, wherein:
   each of the first to fourth memory cells is capable of storing data of two bits.

8. The memory system according to claim 1, wherein:
   each of the data written in the first memory cell of the first string, the data written in the second memory cell of the first string, the data written in the third memory cell of the first string, the data written in the fourth memory cell of the first string, the data written in the first memory cell of the second string, the data written in the second memory cell of the second string, the data written in the third memory cell of the second string and the data written in the fourth memory cell of the second string is based on data specified by a write command from the host device.

* * * * *